(12) United States Patent
Maekawa

(10) Patent No.: US 6,329,284 B2
(45) Date of Patent: *Dec. 11, 2001

(54) MANUFACTURING PROCESS OF A SEMICONDUCTOR DEVICE

(75) Inventor: Kazuyoshi Maekawa, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/916,708

(22) Filed: Aug. 25, 1997

Related U.S. Application Data (63) Continuation of application No. 08/636,934, filed on Apr. 24, 1996, now abandoned.

(30) Foreign Application Priority Data

Oct. 17, 1995 (JP) .................................................. 7-268160

(51) Int. Cl.$^7$ ................................................ H01L 21/4763
(52) U.S. Cl. .......................... 438/637; 438/633; 438/692; 438/638
(58) Field of Search .................... 438/633, 692, 438/637, 643, 644, 645, 656, 638, 666

(56) References Cited

U.S. PATENT DOCUMENTS

| | | | |
|---|---|---|---|
| 4,789,648 | * 12/1988 | Chow et al. | 437/225 |
| 4,994,162 | * 2/1991 | Armstrong et al. | 204/192.15 |
| 5,011,793 | * 4/1991 | Obinata . | |
| 5,171,412 | * 12/1992 | Talieh et al. | 204/192.15 |
| 5,354,711 | * 10/1994 | Heitzmann et al. | 437/182 |
| 5,360,524 | * 11/1994 | Hendel et al. | 204/192.25 |
| 5,527,561 | * 6/1996 | Dobson | 427/383.3 |
| 5,602,423 | * 2/1997 | Jain | 257/752 |
| 5,604,156 | 2/1997 | Chung et al. . | |
| 5,752,875 | * 5/1998 | Ronay | 451/41 |
| 5,892,282 | * 4/1999 | Hong et al. | 257/751 |
| 6,150,252 | * 11/2000 | Hsu et al. . | |

FOREIGN PATENT DOCUMENTS

| | | |
|---|---|---|
| 731503 | * 11/1996 | (EP) . |
| 3-225829 | 10/1991 | (JP) . |
| 5-29591 | 2/1993 | (JP) . |
| 6-77334 | 3/1994 | (JP) . |
| 96-19590 | 6/1996 | (KR) . |
| WO 94/13008 | 6/1994 | (WO) . |

OTHER PUBLICATIONS

IEDM '94, "A Novel High Pressure Low Temperature Aluminum Plug Technology for Sub–0.5 $\mu$m Contact/Via Geometries" G.A. Dixit et al.

K. Mizobuchi, et al., 1995 Symposium on VSLI Technology Digest of Technical Papers, pp. 45–46, "Application of Force Fill Al–Plug Technology to 64MB DRAM and 0.35 $\mu$m Logic".

VSLI, vol. 1019, pp. 456–459, Mar. 25, 1995, "High Temperature Flow Method" (with English translation pp. 1–8).

(List continued on next page.)

Primary Examiner—Caridad Everhart
(74) Attorney, Agent, or Firm—Oblon, Spivak, McClelland, Maier & Neustadt, P.C.

(57) ABSTRACT

An insulating layer is formed on a semiconductor element fabricated in a semiconductor substrate. A groove, with a connecting hole at the bottom part thereof when required, is formed in the insulating layer. A barrier layer is formed on the inner surface of the groove, and the connecting hole, and on the insulating layer. A conductive layer is formed in the groove and on the insulating layer, and is buried into the groove by applying high temperature and high pressure. Then, the conductive layer on the insulating layer is polished to leave the conductive layer in the groove by a CMP method to form an electrodes wire composed of the conductive layer material.

16 Claims, 8 Drawing Sheets

OTHER PUBLICATIONS

Carter W. Kaanta, et al. "Dual Damascene: A ULSI Wiring Technology" 1991 Proc. 8th Int. IEEE VLSI Mult. Intercon. Conf. pp. 144–152. Jun. 1991.*

VLSI, vol. 1019, pp. 456–459, Mar. 25, 1995, HHigh Temperature Flow Method (English Translation). Author Unknown.*

K. Kikuta, et al. "Al–Ge–Cu Multilevel Damascene . . . " IEDM 94 pp 101–103, 1994.*

G. A. Dixit, et al "A Novel High Temperature . . . " IEDM 94 pp 105–108, 1994.*

* cited by examiner

MANUFACTURING PROCESS OF A SEMICONDUCTOR DEVICE

This application is a continuation of application Ser. No. 08/636,934, filed on Apr. 24, 1996, now abandoned.

BACKGROUND OF THE INVENTION

1. Field of the Invention

The present invention relates to a manufacturing method of a semiconductor device, and more particularly to a method of forming electrode wires on an insulating layer of the semiconductor device.

2. Description of the Background Art

In recent years, with micronization of semiconductor devices, a size of a connection hole formed in an insulating layer for electrical connection, between first and second conductive layers, is also micronized. The electrical connection is between a first conductive layer, which is a conductive diffused layer on a principal plane of a semiconductor substrate or a metal film on a semiconductor element, etc., and a second conductive layer, which is a metal film, etc. located on an upper side of the insulating layer.

With such a micronization of a connection hole, an aspect ratio of a connection hole (ratio of height to diameter of a connection hole) is increased. To meet this situation, an attempt has been proposed to achieve an electrical connection between the first conductive layer and second conductive layer, in which the second conductive layer is formed by sputtering and a space in the connection hole is closed by the second conductive layer and is then buried under an atmosphere of high temperature and high pressure.

For example, the Japanese Laid-Open Patent Publication (unexamined) Toku-Hyou-Hei 7-503106 discloses a manufacturing process of a semiconductor device including the steps of closing an upper part of a space in the internal part of a connection hole with a second conductive layer formed by sputtering while leaving the internal space, and burying the second conductive layer into the connection hole, whereby an electrical connection between the first conductive layer and the second conductive layer is achieved. This prior manufacturing process is hereinafter discussed more specifically with reference to FIG. 10 to FIG. 14.

Figure 10:
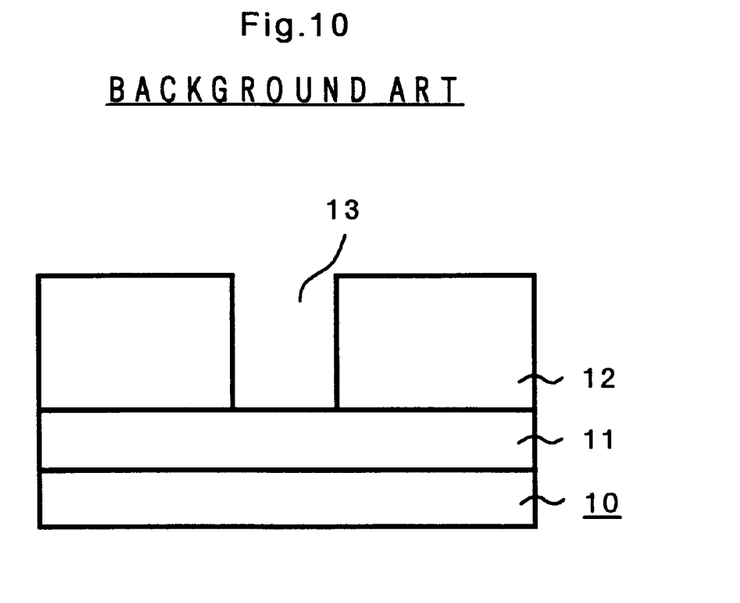
FIGS. 10 through 14 are sectional views of essential parts of a semiconductor device in the order of the manufacturing process in the background art.

First, as illustrated in FIG. 10, a first conductive layer 11 is formed on the upper part of a semiconductor element 10, an insulating layer 12 is further formed thereon, and a connection hole 13 is formed in the insulating layer 12.

Figure 11:
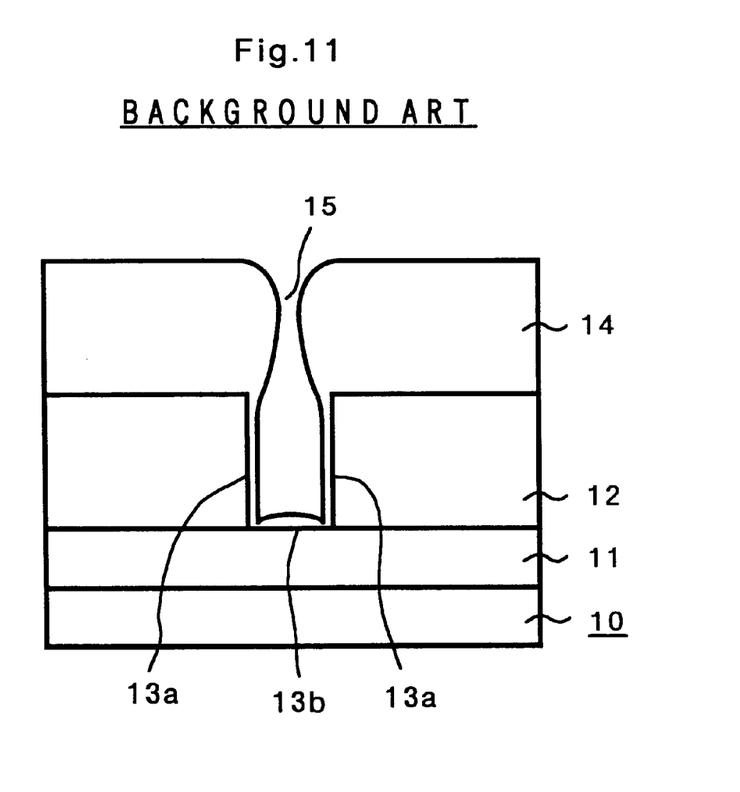

Then, as illustrated in FIG. 11, a second conductive layer 14 is deposited by sputtering on the insulating layer 12 and in the internal part of the connection hole 13. At this time, as illustrated in FIG. 11, a thickness of the second conductive layer 14 deposited on the side wall 13a and on the bottom face 13b of the connection hole 13 is small as compared with that of the second conductive layer 14 coating the surface of the insulating layer 12. While continuing the deposition of the second conductive layer 14, a gap 15 of the second conductive layer 14 on the connection hole 13 is narrowed.

Figure 12:
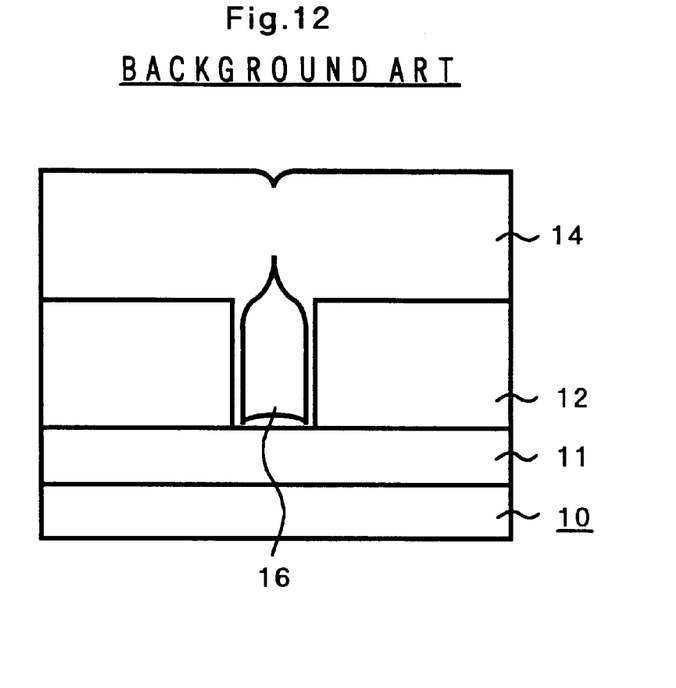

When further continuing the deposition of the second conductive layer 14 by sputtering, as illustrated in FIG. 12, the gap 15 of the second conductive layer on the connection hole 13 comes to be closed while a hollow space 16 being left in the internal part of the connection hole 13 comes to be closed while a hollow space 16 is left in the internal part of the connection hole 13.

Figure 13:
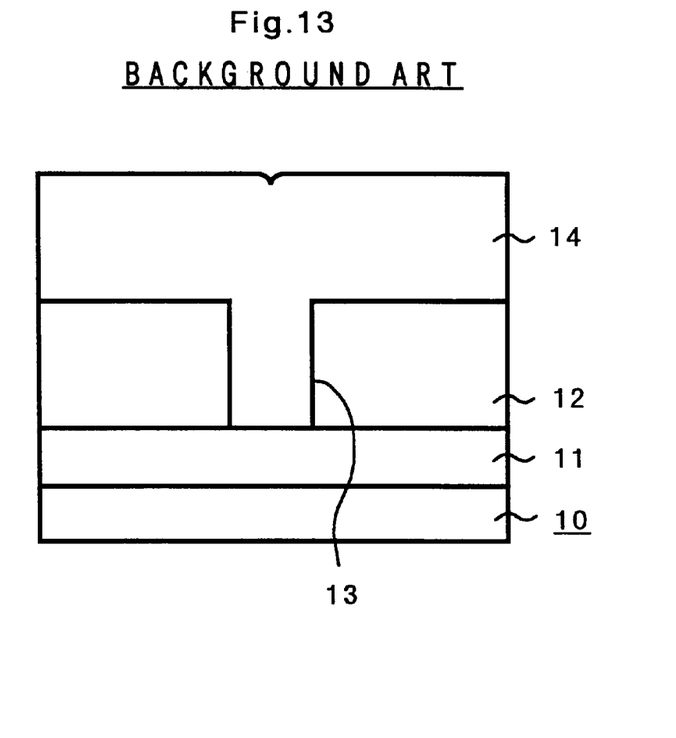

Then, on maintaining the semiconductor device in an atmosphere of high pressure, the second conductive layer 14 is buried into the connection hole 13 until a state illustrated in FIG. 13 is achieved.

Figure 14:
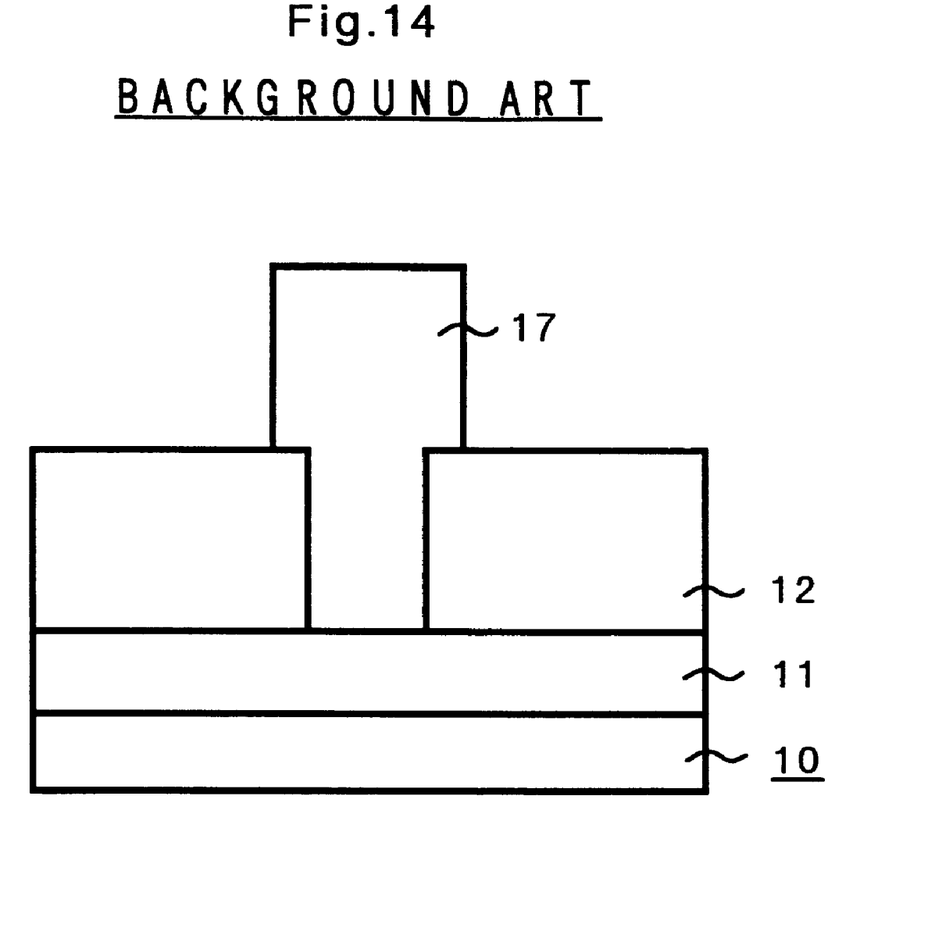

Further, as illustrated in FIG. 14, a conductive wire 17 is formed by etching the second conductive layer 14.

In the above-mentioned manufacturing process of a semiconductor device, the upper part of the hollow space 16 is closed with the second conductive layer 14 formed by sputtering while leaving the hollow space 16 in the internal part of the connection hole. Thereafter, the second conductive layer 14 is buried into the connection hole 13 by applying a high temperature and a high pressure, by which an electrical connection can be established between the first conductive layer 11 and the second conductive layer 14 through the connection hole 13.

However, in the mentioned manufacturing process of a semiconductor device, a problem exists in that etching is required to form the conductive wire 17 formed from the second conductor 14, and the conductive wire 17 formed by etching may be defective and is of a low yield.

SUMMARY OF THE INVENTION

The present invention was made to solve the above-stated problems and it is an object of the present invention to provide a novel manufacturing process of a semiconductor device having connecting electrode wires with less defects and with a high yield.

An aspect of the present invention is a manufacturing process of a semiconductor device which includes a step of forming an insulating layer on a semiconductor substrate or on a semiconductor element formed on the semiconductor substrate. A groove having a connection hole at a bottom part thereof is formed, if required, in the insulating layer. An electrical conductor is formed along the surface of the groove and on the insulating layer. The conductor is buried into the groove by applying a high temperature and a high pressure to the conductor and an electrode wire is formed of the conductor by removing a part of the conductor by the CMP method.

Another aspect of the present invention is a manufacturing process of a semiconductor device which includes a step of forming an insulating layer on a semiconductor substrate or on a semiconductor element formed on the semiconductor substrate. A groove having a connection hole is formed at a bottom part thereof, if required, in the insulating layer. An electrical conductor is formed along the surface of the groove and the insulating layer. The conductor is buried into the groove by applying a temperature of 300 to 850° C. and a pressure of 500 to 900 bar to the conductor and an electrode wire is formed of the conductor by removing a part of the conductor by the CMP method.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 1 and 2a through 8 are sectional views of parts of a semiconductor device in an order of the manufacturing process of the present invention;

FIGS. 2b and 2c are further views of the device as shown in FIG. 2a;

DETAILED DESCRIPTION OF THE PREFERRED EMBODIMENTS

A first embodiment of the present invention is hereinafter described with reference to FIG. 1 to FIG. 9, each illustrating a semiconductor device in an order of manufacturing steps.

Figure 1:
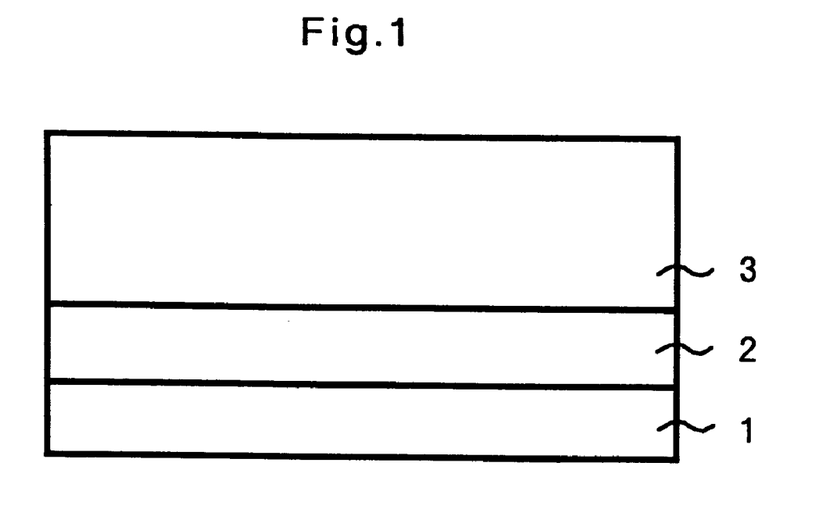

First, as illustrated in FIG. 1, a semiconductor substrate 1, made of a silicon for example, is provided, and a semiconductor element 2, which is composed of a silicon oxide film or the like and a wired layer composed of Al-0.5 wt % Cu alloy for example, is formed on the semiconductor substrate 1. Further, an insulating layer 3, which is made of a silicon oxide film formed by plasma CVD, normal pressure CVD or the like employing TEOS or silane, for example, combined with organic SOG or inorganic SOG, is formed on the semiconductor element 2.

Figure 2A:
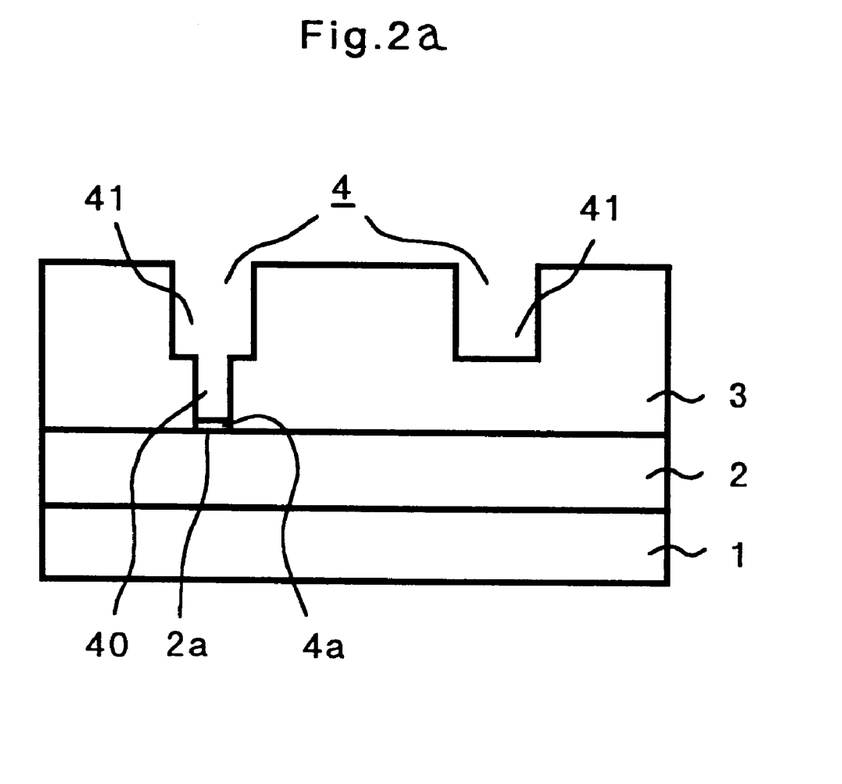
Figure 2B:
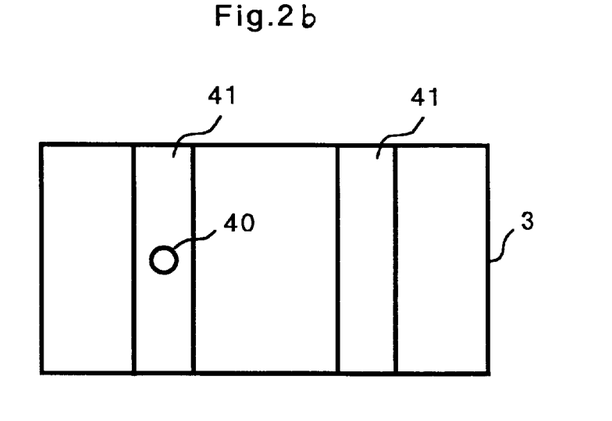
Figure 2C:
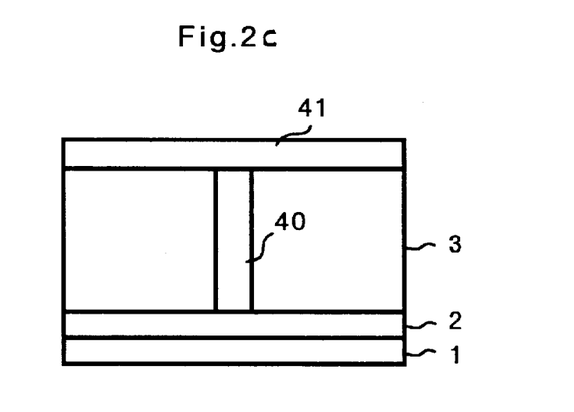

Then, as illustrated in FIG. 2a, at least one groove 4 having a connection hole 40 at the bottom part thereof, if required, is formed utilizing a photomechanical process on the insulating layer 3. A plan view of this construction is shown in FIG. 2b and a cross sectional view along a groove 41 is shown in FIG. 2c. As seen in these drawings, a groove 41 runs along a main surface of the insulating layer 3 and the connecting hole 40 extends downwards to underlying semiconductor substrate 1 or semiconductor element 2. The groove 41 and the connecting hole 40 are formed by a photomechanical process technology, and then the grooves 41 are formed corresponding to the wiring pattern. The width of the groove 41 is usually around 1 $\mu$m ranging from 0.1 $\mu$m to 50 $\mu$m. The diameter of the connecting hole is generally from 0.1 to 1 $\mu$m. It may happen that the width of the groove 41 is equal to the diameter of the connecting hole 40.

After forming the groove 4, materials such as water, nitrogen, hydrogen or other organic matters, etc., stuck to the surface of the semiconductor device under manufacture are removed by heating (hereinafter referred to as degassing). More specifically, the degassing is performed by heating at a temperature of 250 to 500° C. for 60 to 300 seconds under an atmosphere of inert gas such as Ar of 1 to 2 Torr.

In this step, if required, a natural oxide film 4a is removed by sputtering or etching maintaining a high vacuum condition of 10–5 Torr (this state is hereinafter referred to as a continuous vacuum). The natural oxide film 4a is formed on a part of the surface of the semiconductor element 2 at a bottom face of the mentioned connection hole 40. More specifically, the natural oxide film 4a of 50 to 300 Å in terms of Si oxide film is removed using a low damage etching by ICP (Inductive Coupled Plasma) on conditions of 0.5 to 1.5 mTorr in Ar atmosphere, 300 to 500 W in ICP power, and 100 to 450V in bias voltage.

Figure 3:
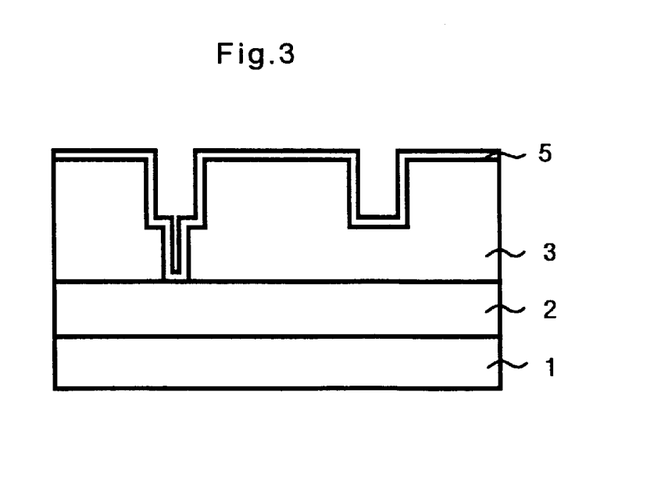

Then, as illustrated in FIG. 3, a barrier layer 5 is formed on the bottom face of the groove 4, which is a part of the surface of the semiconductor element 2, and on the surface of the insulating layer 3 by sputtering under the continuous vacuum. The barrier layer 5 is formed of a barrier metal layer composed of TiN/Ti:1000 Å/150 Å, TiN/Ti:1000 Å/200 Å, TiN/Ti:500 Å/150 Å, or TiN/Ti:500 Å/200 Å. The temperature for heating the semiconductor substrate 1 at the time of the film formation may be 50 to 500° C., for example. A Ti layer is formed downside, that is in contact with the insulating layer and a TiN layer is formed upside. This barrier layer works to slide in a conductor layer in the later stage.

Figure 4:
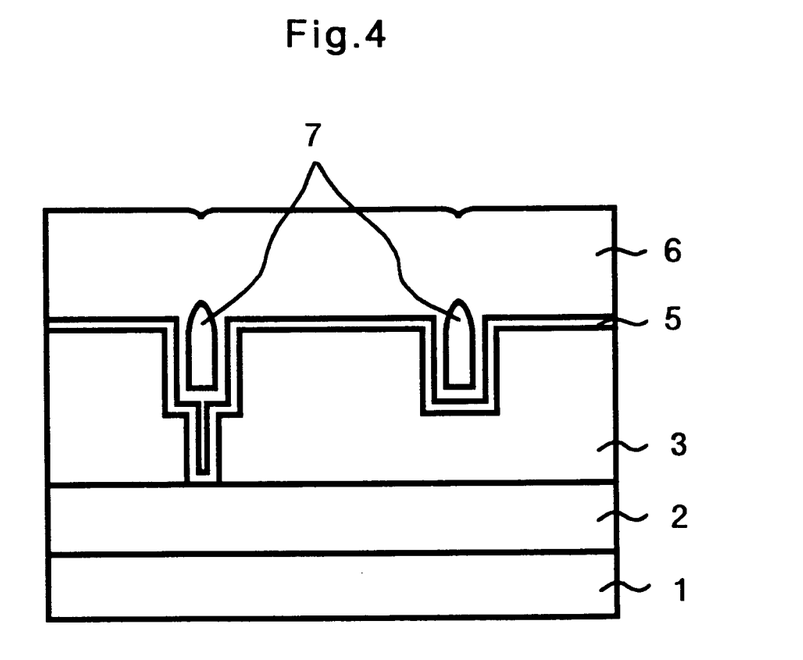

Then, as illustrated in FIG. 4, a conductor 6 composed of pure Cu, for example, is formed in the groove 4 and on the insulating layer 3 under the continuous vacuum. More specifically, first, a film of 50 to 200 nm is formed by sputtering under Ar atmosphere of 1 to 10 mTorr, with an ICP power of 5 to 20 kW and at a heating temperature of 25 to 150° C. Then, a film of desired thickness is formed by sputtering at a heating temperature of 300 to 450° C. The thickness of the formed film ranges from 300 nm to 2 $\mu$m. In this regard, the maximum temperature of the semiconductor substrate 1 is limited to 600° C.

A film thickness of the conductor 6 is more than 1.2 times as large as the diameter of the connection hole 40 and less than 3 $\mu$m. The conductor 6 more than 1.2 times thick covers the upper part of the groove 4 and a thickness of 3 $\mu$m is enough. Although a hollow space 7 may be formed in the groove 4 at this time, it does not matter herein.

The reason why the conductor 6 is heated at a relatively low temperature in the initial stage of the film formation for forming the conductor 6 is described hereinbelow.

When the semiconductor substrate 1 is exposed to the plasma atmosphere at the time of film formation, an actual temperature of the semiconductor substrate 1 rises higher than the heating temperature and a gas is produced from the side wall of the groove 4 or from the barrier layer 5, whereby the conductor 6 is oxidized or nitrified by the gas, resulting in deterioration of burying characteristic.

Therefore, first, 50 to 200 nm of the conductor 6 is formed at a low temperature, thereby coating the side wall of the groove 4 and the barrier layer 5 with the conductor 6 to restrain the production of gas, and then the conductor 6 of satisfactory crystallization is formed by heating the semiconductor substrate 1.

Figure 5:
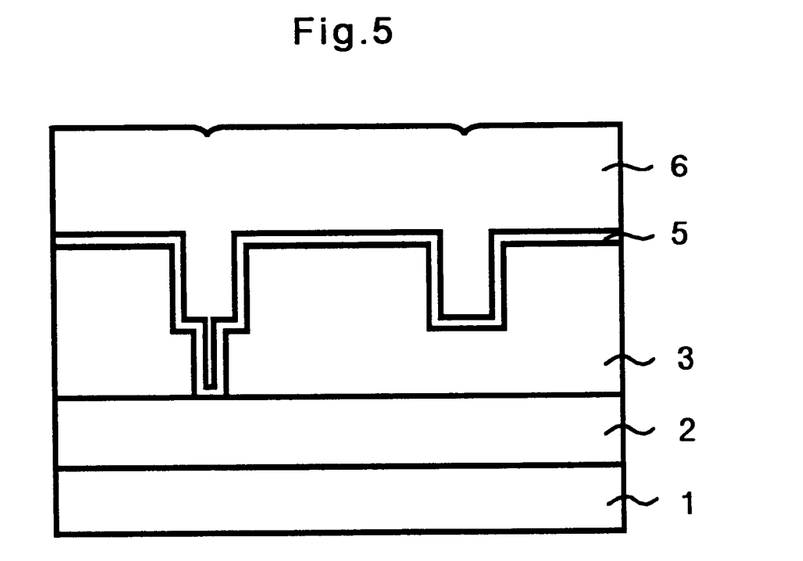

Then, as illustrated in FIG. 5, the hollow space 7 disappears by maintaining the conductor 6 under a high temperature and a high pressure in the continuous vacuum, and the groove 4 is filled with the conductor 6. More specifically, the conductor 6 is maintained for 1 to 20 minutes at a temperature of 350 to 750° C. and a pressure of 650 to 900 bar under an atmosphere of inert gas such as Ar.

Figure 6:
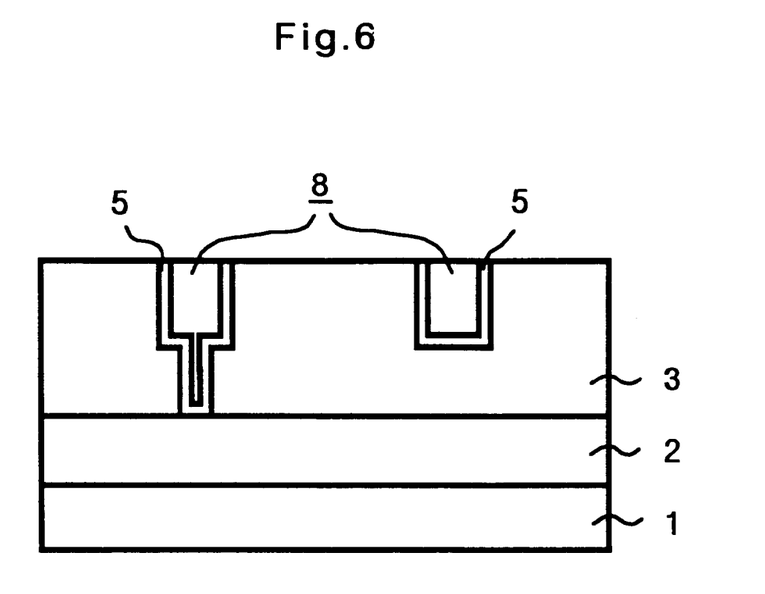

Then, as illustrated in FIG. 6, polishing by the CMP method is performed so that the conductor 6 is left only in the groove 4, whereby electrode wires 8 comprised of the conductor 6 are formed. In this step, propionic acid and $H_2O_2$ are employed as an etchant for CMP, for example.

Figure 7:
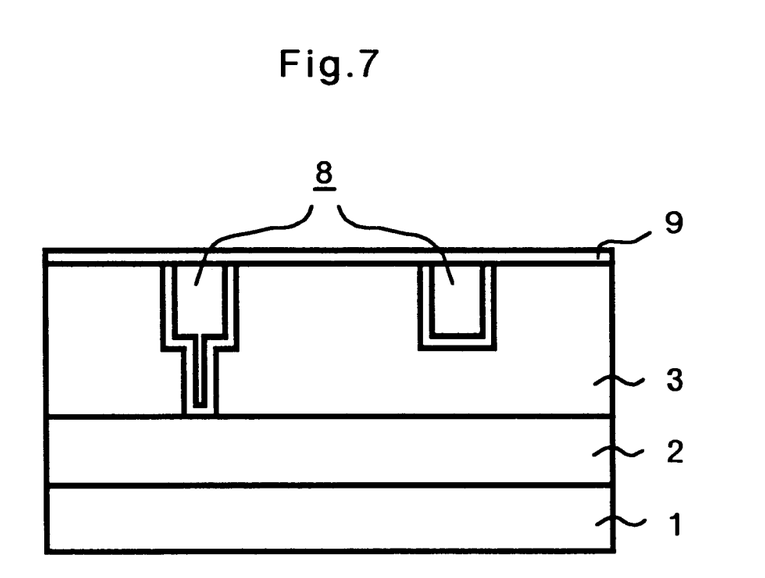
Figure 8:
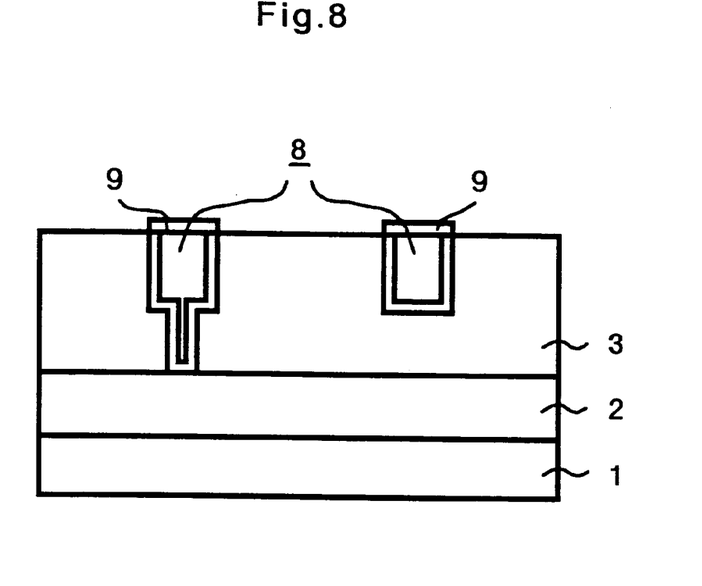

If required, after the polishing by the CMP, an anti-reflection film 9 composed of Ti, for example, is formed on the electrode wires 8 and the insulating layer 3, as illustrated in FIG. 7, and then the anti-reflection film 9 is left only on the electrode wires 8 by the conventional photomechanical process, see FIG. 8. This anti-reflection film 9 works to decrease reflecting light when another layer is formed thereon in the later stage.

In the manufacturing process of a semiconductor device as stated above, since the conductor 6 is buried in the groove 4 under a high temperature and a high pressure, electrode wires 8 of a large grain of conductor material and of less defects such as void can be formed with a high yield. Further, the polishing is performed by the CMP method to leave the conductor 6 only in the groove 4 so that the electrode wires 8 of a plane surface can be formed.

Although the groove 4 is formed in the insulating layer 3 located on the semiconductor element 2, which is formed on the semiconductor substrate 1, in the embodiment above, it is also possible that the insulating layer 3 is formed immediately on the semiconductor substrate 1, and the groove 4 is formed in such an insulating layer 3.

Further, in this embodiment, an interval between one step and another, i.e., between any two steps of degassing, removal of the natural oxide film 4a, formation of the barrier layer 5, and formation of the conductor 6, is kept in the continuous vacuum state without cooling. It is, however, also possible that the semiconductor substrate 1 is cooled to 25 to 200° C. in the continuous vacuum state in the interval between a respective two steps. In a case of employing such a cooling between a respective two steps before the formation step of the barrier layer 5, the barrier layer formation is performed at 25 to 200° C., while the barrier layer formation is performed at 300 to 600° C. in a case of employing no cooling. Furthermore, when in a case of performing such a cooling between a respective two steps before the formation step of the conductor 6, the conductor formation is performed at 25 to 200° C., while the conductor formation is performed at 300 to 600° C. in a case of employing no cooling. The same advantages as the foregoing arrangement are also achieved in this modification.

Although the degassing is performed by heating at a temperature of 250 to 500° C. for 60 to 300 seconds under an atmosphere of inert gas such as Ar of 1 to 2 Torr in the foregoing embodiment, it is also possible that the degassing is performed by heating at a temperature of 200 to 600° C. for 30 to 600 seconds under an atmosphere of inert gas such as Ar of 1 to 10 Torr. The same advantages as the foregoing embodiment are also achieved in this modification.

Although a portion of the natural oxide film 4a correspondingly to 50 to 300 Å in terms of Si oxide film is removed in the foregoing embodiment on conditions of 0.5 to 1.5 mTorr in Ar atmosphere, 300 to 500 W in ICP power, and 100 to 450V in bias voltage, it is also possible that the natural oxide film 4a corresponding to 30 to 400 Å in terms of Si oxide film is removed on conditions of 0.1 to 5 mTorr in Ar atmosphere, 100 to 600 W in ICP power, and 50 to 600V in bias voltage.

Further, it is also possible to omit the step of removing the natural oxide film 4a as long as there is no problem in the electrical connection between the semiconductor element 2 and the electrode wires 8. The same advantages as the foregoing embodiment are also achieved in this modification.

Although the barrier layer 5 is formed of any of Tin/Ti:1000 Å/150 Å, TiN/Ti:1000 Å/200 Å, TiN/Ti:500 Å/150 Å or TiN/Ti:500 Å/200 Å in this embodiment, it is also possible that the barrier layer 5 is formed of a material composed of TiN/Ti:100 to 1000 Å/20 to 500 Å. The same advantages as the foregoing embodiment are also achieved in this modification.

Although the barrier layer 5 is formed into the TiN/Ti structure in the foregoing embodiment, it is also possible that the barrier layer 5 is formed in a Ti or Ti/TiN/Ti structure. More specifically, it is possible to employ a structure of Ti/TiN/Ti:20 to 500 Å/100 to 1500 Å/20 to 500 Å. Likewise, it is possible to employ Ti, W, Ta or TiW or nitride of any of them, or employ a composite film formed by stacking them.

From the viewpoint of improvement in coverage, it is also possible to employ collimation sputtering, low pressure sputtering or long range sputtering as a sputtering for forming the barrier layer 5. More specifically, in a case of employing the collimation sputtering, for example, at the time of sputtering, conditions are established such that a pressure is 1 to 8 mTorr, a power is 8 to 20 kW, a flow ratio of $N_2/N_2+Ar$ is 0.2 to 0.9 in gas atmosphere, and a diameter of the opening of collimator:length thereof is 1:1 to 1:1.75 in an aspect ratio of the collimator. In a case of employing the low pressure sputtering, for example, at the time of sputtering, conditions are established such that a pressure is 0.2 to 5 mTorr, a power is 1 to 20 kW, and a flow ratio of $N_2/N_2+Ar$ is 0.1 to 0.9 in gas atmosphere. In a case of employing the long range sputtering, for example, at the time of sputtering, conditions are established such that a pressure is 0.2 to 8 mTorr, a power is 8 to 20 kW, a flow ratio of $N_2/N_2+Ar$ is 0.1 to 0.9 in gas atmosphere, and a distance between the semiconductor substrate 1 and a sputtering target is 40 to 400 nm. The same advantages as the foregoing embodiment are also achieved in these modifications.

Although sputtering is employed as a formation process of the barrier layer 5 in the foregoing embodiment, it is also possible to employ a CVD method using an organic gas including $TiCl_4$ or Ti as a raw material gas. The barrier layer 5 may be a composite film made of a film formed by sputtering and a film formed by the CVD method. Further, in a case of forming the barrier layer 5 by the CVD method, it is also possible that the semiconductor device under manufacture is once aerated (i.e., exposed to outside air) for degassing, and a barrier layer is further stacked on the barrier layer 5 by sputtering. The same advantages as the foregoing embodiment are also achieved in these modifications.

Although the barrier layer 5 is formed in the foregoing embodiment, it is not always necessary to form the barrier layer 5. The same advantages as the foregoing embodiment are also achieved in this modification.

Although sputtering is employed as a formation of the Cu serving as the conductor 6 in the foregoing embodiment, it is also possible that the Cu is formed by the CVD method. In this case, Cu(HFA)TMVS is used as a raw material gas, and the substrate is heated at a temperature of 100 to 300° C. The same advantages as the foregoing embodiment are also achieved in this modification.

Although a thickness of the conductor 6 is 1.2 times as large as a diameter of the connection hole 40 or more and 3 $\mu$m or less in the foregoing embodiment, it is also preferable that the thickness is 0.8 times as large as the diameter of the connection hole 40 or more and 5 $\mu$m or less. The same advantages as the foregoing embodiment are also achieved in this modification.

Although a pure Cu is employed as the conductor 6 in the foregoing embodiment, it is also possible to employ a material which contains 0.01 to 2% Al, Ti, Sc, Pd, Si, Ta, Mn, Mg, Nb, Cr, Co, Ni, Ag, Pt, W, Au or V with respect to Cu. It is also possible to employ a material which contains not less than two of these mentioned elements at 0.1 to 2% each with respect to Cu. Further, the principal component of the conductor 6 may be Al, Ag, or Pt. The conductor 6 may be formed of pure Al, pure Ag or pure Pt.

In a case of employing Al as the principal component of the conductor 6, the Al may be formed by the CVD method, and in which case, for example, DMAH may be employed as raw material gas and the substrate may be heated at a temperature of 200 to 300° C. Further in this case, any additive element other than Al may be added by mixing a gas containing such an element at the time of formation by the CVD method. It is also possible that only film formation of the additive element is performed by sputtering and, then, Al is formed by the CVD method and is subject to a reaction by annealing. The same advantages as the foregoing embodiment are also achieved in these modifications.

Although the conductor 6 is buried in the groove 4 under a high temperature and a high pressure in the foregoing embodiment, it is also possible to hold the conductor 6 under specific conditions of 300 to 850° C. in temperature and 50 M to 90 MPa in pressure for 1 to 40 minutes. Further, although an atmosphere of inert gas such as Ar is employed at the time of applying the high temperature and high pressure, it is also possible that, when the conductor 6 is made of pure copper or an alloy principally composed of Cu, an oxidizing atmosphere containing 2 to 30% oxygen other than the inert gas, a reducing atmosphere containing 2 to 30% hydrogen other than the inert gas, or an oxygen and reducing atmosphere containing both oxygen and nitrogen is employed. The same advantages as the foregoing embodiment are also achieved in these modifications.

In the foregoing embodiment, it is also possible to employ as an etchant for the CMP method, a mixture of acetic acid and hydrogen peroxide water (acetic acid:water:hydrogen peroxide water=0.3 to 0.6:10:0.01 to 0.1), acetic acid (acetic acid:water=0.3 to 0.6:10), a mixture of nitric acid and hydrogen peroxide water (nitric acid:water:hydrogen peroxide water=0.1 to 10:120:0.01 to 1), or a mixture of ammonium persulfate and hydrogen peroxide water (ammonium persulfate:water:hydrogen peroxide=0.1 to 5:350:0.01 to 0.1). The same advantages as the foregoing embodiment are also achieved in these modifications.

Although the anti-reflection film 9 is made of Ti in the foregoing embodiment, it is also possible to employ an oxide, nitride or oxide-nitride of Si, or Ti, Ta, W, TiW, Mo, C or an oxide or nitride of these elements. Further, it is also possible that the anti-reflection film 9 is formed into a shape shown in FIG. 8 by selectively forming it on the electrode wires by the CVD method. Furthermore, in a case of the anti-reflection film 9 made of the mentioned oxide, nitride or oxide-nitride of Si, it is also possible to advance to the next process with the anti-reflection film 9 stacked on the insulating layer 3, without reforming the anti-reflection film 9 to leave only on the electrode wire 8 after forming the anti-reflection film 9 as illustrated in FIG. 7. The same advantages as the foregoing embodiment are also achieved in this modification.

Figure 9:
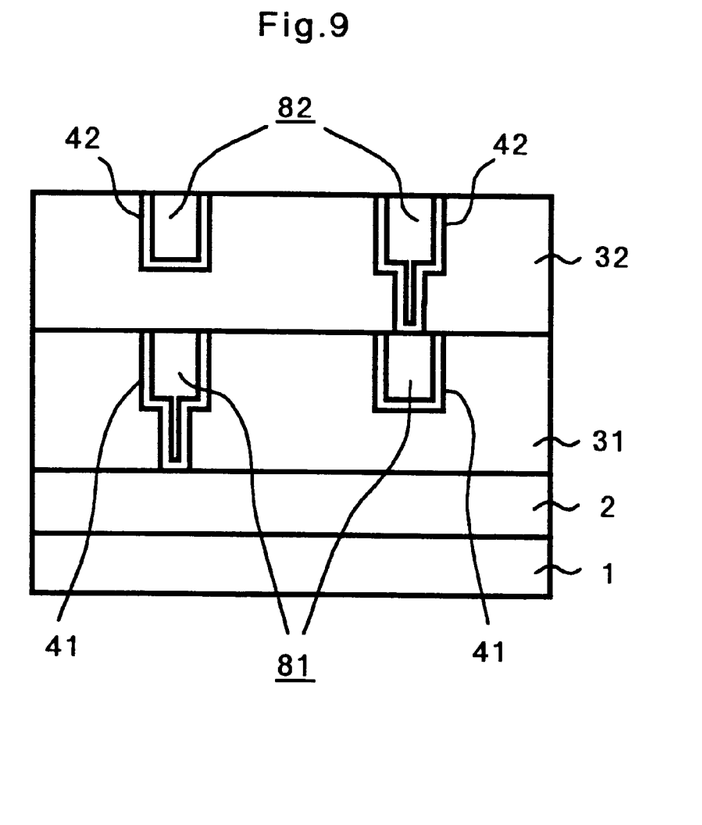
FIG. 9 is a sectional view of parts of a semiconductor device in another embodiment of the manufacturing process of the present invention.

Although wires of a single layer are formed in the embodiment, it is also possible that, as illustrated in FIG. 9, wires of multiple layers are formed by employing the same wire formation method for forming the respective wires as shown in the first embodiment. In the construction as shown in FIG. 9, the semiconductor device includes a lower insulating layer 31 having grooves 41, in which lower electrode wires 81 are formed, and an upper insulating layer 32 having grooves 42, in which upper electrode wires 82 are formed. The same advantages as the foregoing embodiment are also achieved in this modification.

As described above, the manufacturing process of a semiconductor device in accordance with the present invention exhibits an effect that electrode wires of less defects and greater yield can be manufactured.

Obviously, numerous additional modifications and variations of the present invention are possible in light of the above teachings. It is therefore to be understood that within the scope of the appended claims, the present invention may be practiced otherwise than as specifically described herein.

What is claimed as new and desired to be secured by Letters Patent of the United States is:

1. A process for manufacturing a semiconductor device comprising the steps of:

forming an insulating layer on a semiconductor substrate or on a semiconductor element formed on the semiconductor substrate;

forming a groove on said insulating layer;

forming a connecting hole at a bottom of said groove to extend through said insulating layer;

forming a barrier layer in said groove and on said insulating layer;

forming a conductor on said barrier layer;

burying said conductor into said groove and said connecting hole by applying at least a first temperature and a first pressure to said conductor; and forming electrode wires comprised of said conductor by removing all parts of said conductor outside said groove by a CMP method so that said conductor only remains in said groove, wherein a thickness of said conductor is more than 0.8 times of a diameter of said connection hole and less than 5 $\mu$m.

2. A process for manufacturing a semiconductor device as defined in claim 1, wherein said conductor contains an alloy principally composed of a material selected from the group consisting of Cu, Al, Ag and Pt or contains a metal selected from the group consisting of pure Cu, pure Al, pure Ag and pure Pt.

3. A process for manufacturing a semiconductor device as defined in claim 1, wherein a thickness of said conductor is more than 1.2 times of a diameter of said connection hole and less than 3 $\mu$m.

4. A process for manufacturing a semiconductor device as defined in claims 1, wherein said conductor is formed at a second temperature in a first stage of the forming step thereof and at a third temperature in a second subsequent stage of the forming step thereof, wherein the third temperature is higher than the second temperature.

5. A process for manufacturing a semiconductor device as defined in claim 1, wherein said conductor is formed first at a second temperature of 25 to 150° C. by 50 to 200 nm and is then formed at the first temperature to a desired thickness.

6. A process for manufacturing a semiconductor device as defined in claim 1, wherein the first temperature and the first pressure applied for burying said conductor into said groove are respectively 300 to 850° C. and 50 M to 90 Mpa.

7. A process for manufacturing a semiconductor device as defined in claim 1, wherein the first temperature and the first pressure applied for burying said conductor into said groove are respectively 350 to 750° C. and 65 M to 90 MPa.

8. A process for manufacturing a semiconductor device as defined in claim 1, further comprising a step of forming an anti-reflection film on said electrode wires.

9. A process for manufacturing a semiconductor device comprising the steps of:

forming an insulating layer on a semiconductor substrate or on a semiconductor element formed on the semiconductor substrate;

forming a groove on said insulating layer;

forming a connection hole at a bottom of said groove to extend through said insulating layer;

forming a barrier layer on surfaces of said groove, said connecting hole and said insulating layer;

forming a conductor on surfaces of said barrier layer;

burying said conductor into said groove and said connecting hole by applying at least a first temperature and a first pressure to said conductor; and forming electrode wires comprised of said conductor by removing all parts of said conductor outside said groove by a CMP method so that said conductor only remains in said groove, wherein a thickness of said conductor is more than 0.8 times of a diameter of said connection hole and less than 5 μm.

10. A process for manufacturing a semiconductor device as defined in claim 9, wherein said barrier layer is composed of a metal selected from the group consisting of TiN/Ti,Ti and Ti/TiN/Ti.

11. A process for manufacturing a semiconductor device comprising the steps of:

forming an insulating layer on a semiconductor substrate or on a semiconductor element formed on the semiconductor substrate;

forming a groove on said insulating layer;

forming a connecting hole at the bottom of said groove;

forming a barrier layer in said groove and on said insulating layer;

forming a conductor on said barrier layer;

burying said conductor into said groove and said connecting hole by applying at least a first temperature and a first pressure to said conductor, wherein the first temperature and the first pressure applied for burying said conductor into said groove are respectively 300 to 850° C. and 50 M to 90 Mpa; and forming electrode wires comprised of said conductor by removing all parts of said conductor outside said groove by a CMP method so that said conductor only remains in said groove, wherein said conductor contains an alloy principally composed of a material selected from the group consisting of Cu, Al, Ag and Pt or contains a metal selected from the group consisting of pure Cu, pure Al, pure Ag and pure Pt, and wherein a thickness of said conductor is more than 0.8 times of a diameter of said connection hole and less than 5 μm.

12. A process for manufacturing a semiconductor device as defined in claim 11, wherein a thickness of said conductor layer is more than 1.2 times of a diameter of said connection hole and less than 3 μm.

13. A process for manufacturing a semiconductor device as defined in claim 11, wherein said conductor is formed at a second temperature in a first stage of the forming step thereof and at a third temperature in a second subsequent range of the forming step thereof, wherein the third temperature is higher than the second temperature.

14. A process for manufacturing a semiconductor device as defined in claim 11, wherein said conductor is formed first at a second temperature of 25 to 150° C. by 50 to 200 nm and is then formed at the first temperature to a desired thickness.

15. A process for manufacturing a semiconductor device as defined in claim 11, wherein the first temperature and the first pressure applied for burying said conductor into said groove are respectively 350 to 750° C. and 65 M to 90 MPa.

16. A process for manufacturing a semiconductor device as defined in claim 11, further comprising a step of forming an anti-reflection film on said electrode wires.

* * * * *